United States Patent [19]

Wilson

[11] Patent Number: 4,463,314
[45] Date of Patent: Jul. 31, 1984

[54] EARTH FIELD COMPENSATION FOR A MAGNETIC DETECTOR BY IMPARTING A PERMANENT MAGNETIZATION TO A MAGNETIC MATERIAL CONTIGUOUS THE DETECTOR

[75] Inventor: James H. Wilson, Severna Park, Md.

[73] Assignee: Westinghouse Electric Corp., Pittsburgh, Pa.

[21] Appl. No.: 172,791

[22] Filed: Jul. 28, 1980

[51] Int. Cl.³ .................. G01R 33/02; G01C 17/38
[52] U.S. Cl. ........................... 324/244; 324/253; 33/357
[58] Field of Search .............. 324/244, 253, 254, 255, 324/225, 345; 33/361, 356, 357; 361/146

[56] References Cited

U.S. PATENT DOCUMENTS

| | | | |
|---|---|---|---|
| 2,151,627 | 3/1939 | Vacquier | 324/345 |
| 2,241,499 | 5/1941 | Barth | 324/244 |
| 2,715,198 | 8/1955 | Tolles | 317/123 |
| 2,743,415 | 4/1956 | Williams et al. | 324/246 |
| 2,891,216 | 6/1959 | Linder | 324/246 |
| 2,938,164 | 5/1960 | Hansburg | 324/253 |
| 3,311,821 | 3/1967 | Brunel | 324/253 |
| 3,389,333 | 6/1968 | Wolff et al. | 324/225 |
| 3,441,841 | 4/1969 | Salvi et al. | 324/244 |
| 3,639,828 | 2/1972 | Salvi | 324/301 |
| 3,736,502 | 5/1973 | Schonstedt | 324/248 |
| 3,991,361 | 11/1976 | Mattern et al. | 33/356 |
| 4,058,782 | 11/1977 | Forster | 361/146 |
| 4,152,745 | 5/1979 | Eul | 361/146 |

Primary Examiner—Gerard R. Strecker
Assistant Examiner—Walter E. Snow
Attorney, Agent, or Firm—D. Schron

[57] ABSTRACT

A magnetometer compensation scheme wherein a magnetizable material adjacent the magnetometer is given a certain permanent magnetization to cancel the effect of the earth magnetic field at the location of the magnetometer.

8 Claims, 6 Drawing Figures

EARTH FIELD COMPENSATION FOR A MAGNETIC DETECTOR BY IMPARTING A PERMANENT MAGNETIZATION TO A MAGNETIC MATERIAL CONTIGUOUS THE DETECTOR

BACKGROUND OF THE INVENTION

1. Field of the Invention

The invention in general relates to magnetic detectors, and particularly to a method and apparatus for nulling the detector in the presence of the earth's magnetic field at the detector location.

2. Description of the Prior Art

Magnetic detectors such as magnetometers are used to measure magnetic fields or changes in magnetic fields. In the detection of a magnetic object, the magnetic signal of interest may be relatively small compared to the ambient field of the earth and accordingly to obtain higher sensitivity many magnetometers are of the type which provide an output signal indicative of only a change in the magnetic field at its location as opposed to the absolute value of it. To accomplish this, the relatively steady earth's magnetic field must be subtracted from the signal containing the magnetic field change of interest.

In one type of compensation system in which the earth's magnetic field is subtracted from the measurement, a fixed voltage representing the earth's magnetic field is subtracted from the magnetometer output so that only changes to the field are observed. This compensation system, however, requires a very stable voltage source and low drift amplifiers.

In another type of compensation scheme, a high resolution data system is utilized to record the output of the magnetometer and thereafter a fixed quantity representing the earth's magnetic field is subtracted from the data so that the resulting data is the measurement of interest. This method requires extremely high resolution in the measurement of the magnetometer output in order to obtain a resultant signal with a fair degree of accuracy.

In another widely used compensation arrangement, the magnetometer is placed within a solenoid which is connected to a current source. The current through the solenoid is adjusted until it induces a field equal and opposite to the earth's magnetic field such that the magnetometer effectively sees a zero field. The solenoid field is then held at this constant value such that the output signal of the magnetometer is indicative of only change in magnetic field due to the magnetic disturbance. Although this system is highly effective, it requires continuous power, high mechanical stability in the solenoid, and extremely high stability in the current source driving the solenoid.

The present invention allows for earth field compensation in an arrangement which eliminates the objectional features of the prior art compensation arrangements.

SUMMARY OF THE INVENTION

The apparatus of the present invention includes a magnetic detector for placement at a site and being subject to the influence of the earth's magnetic field. A magnetic material is contiguous the detector and circuit means are provided for imparting a controlled permanent magnetization to the magnetic material, the value of retentivity or permanent magnetization imparted being such to substantially cancel the effect of the earth's magnetic field at the location of the detector.

The circuit means is operable to either increase or decrease the magnitude of the permanent magnetization until the detector in essence sees a zero external field. When this point is reached, no further adjustment of the magnetic material need be made and all power to the magnetizing circuit may be removed.

DESCRIPTION OF THE PREFERRED EMBODIMENT

Figure 1:
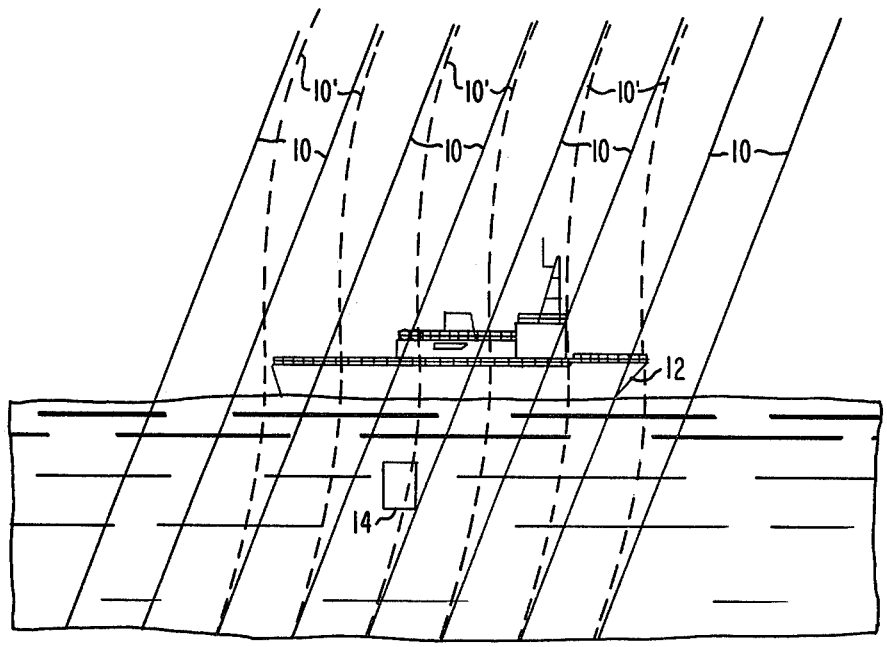
FIG. 1 illustrates a situation wherein a magnetic detector may be utilized.

Magnetic detectors are utilized in a variety of systems, one of which is illustrated in FIG. 1 by way of example. In FIG. 1, the earth's magnetic field as represented by solid lines 10 may be distorted as indicated by dotted lines 10' by the presence of a vessel, such as surface ship 12. A magnetic detector 14 is in a position to detect this change in the magnetic field caused by the surface vessel. One commonly utilized magnetic detector is a magnetometer which is permanently placed into position and thereafter nulled so as to eliminate the influence of the earth's magnetic field in order to better detect the presence of a vessel so that appropriate action may be taken in response to the detection.

Figure 2:
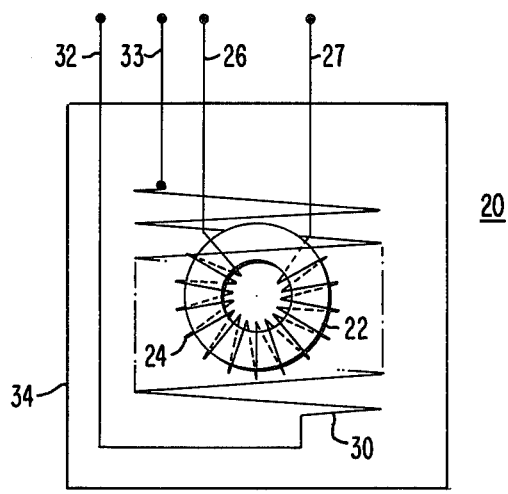
FIG. 2 is a view of one form of magnetic detector which may be utilized herein.

FIG. 2 illustrates by way of example a typical magnetic detector in the form of a flux gate magnetometer 20. The magnetometer includes a toroidal core 22 having a toroidal winding 24 thereabout and supplied with an AC drive signal on leads 26 and 27 from a drive source (not illustrated). A solenoid or sense winding 30 surrounds the core 22 and its winding 24 and is utilized in conjunction with conventional magnetometer equipment to provide an output signal at leads 32, 33 indicative of a magnetic disturbance. The core and windings are generally placed in a housing or encapsulation material 34. In order to null the instrument by eliminating the effect of the earth's magnetic field at the location of the magnetometer, prior art arrangements, as previously brought out, either required a constant biasing by an active source or extremely stable and accurate ancillary equipment for subtracting out or eliminating the magnitude of the earth's magnetic field.

In the present invention, a magnetic material is placed contiguous the magnetometer and a permanent magnetization is imparted to this material, with the active elements for accomplishing this being thereafter turned off, or removed. The resultant magnetization of the magnetic material is of a value to substantially cancel the effect of the earth's magnetic field at the magnetometer location.

Figure 3:
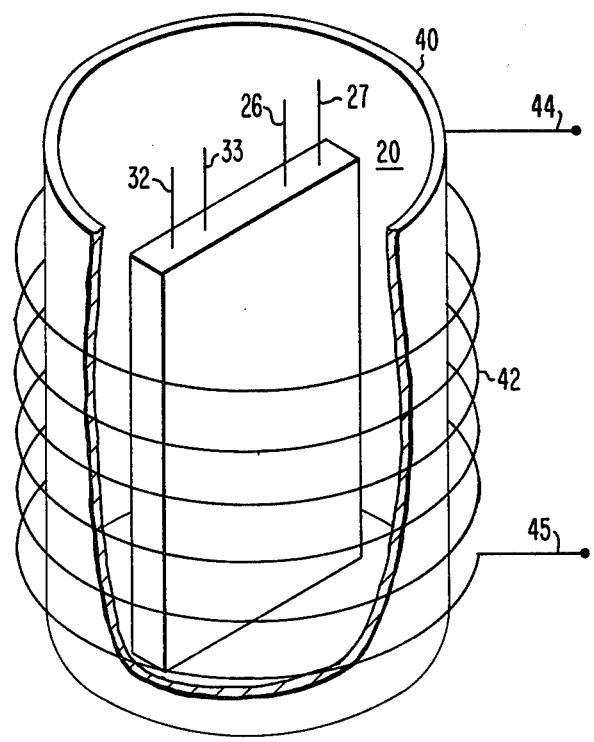
FIG. 3 is a view, with a portion broken away, of an embodiment of the present invention.

FIG. 3 illustrates one embodiment of the present invention. The assembly of FIG. 3 includes a magnetic material 40 which in one embodiment completely surrounds the magnetometer 20. In one experimental setup, the magnetic material 40 was comprised of a plurality of turns of one inch wide magnetic video recording tape directly contacting the outside of magnetometer 20. Numerous other forms of magnetic material are also possible as long as the material is of the type capable of assuming a permanent magnetization and located in a position to effect the magnetometer output.

In order to impart a controlled and permanent magnetization to magnetic material 40, there is provided a magnetizing winding 42 surrounding the magnetic material 40 and to which is applied certain control current at leads 44, 45. In the embodiment utilizing the plurality of turns of video recording tape, the magnetizing winding consisted of several hundred turns of #32 wire. One example of a circuit which can accomplish the controlled permanent magnetization of magnetic material 40 is illustrated in FIG. 4 to which reference is now made.

Figure 4:
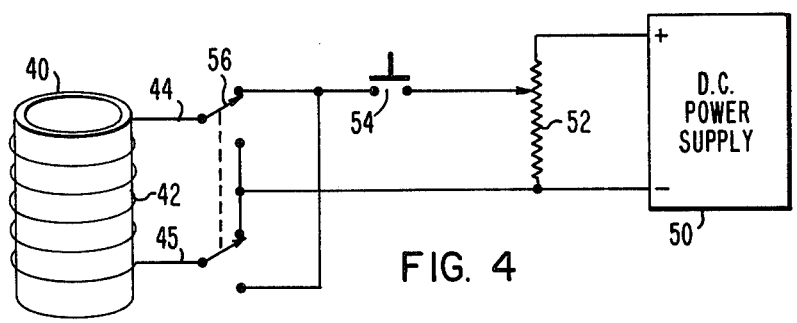
FIG. 4 illustrates an embodiment of a circuit for achieving the earth's field compensation in accordance with the present invention.

The apparatus of FIG. 4 includes the direct current power supply 50 operable to supply magnetizing current to magnetizing winding 42 surrounding magnetic material 40. The magnitude, duration and polarity of the current supplied is governed by an adjustable potentiometer 52, a pulse pushbutton switch 54, and a reversing switch 56.

With pushbutton switch 54 closed, and with reversing switch 56 in the position illustrated, current will flow through magnetizing winding in a first direction, and with reversing switch 56 in its other position, current will flow through magnetizing winding 42 in an opposite direction.

Initially, to demagnetize material 40 the potentiometer 52 is adjusted so as to supply a relatively large current to magnetizing winding 42 utilizing pushbutton 54 and reversing switch 56. By operating reversing switch 56 and by reducing the amplitude of the current supply, alternate polarity pulses of decreasing amplitude are applied to the coil and this procedure is continued until zero current is obtained, at which time the magnetic material will be demagnetized and any output of the magnetometer will be due to the earth's magnetic field at that location. Thereafter, the potentiometer 52 is adjusted so as to provide, through operation of pushbutton switch 54, a small current pulse to magnetizing winding 42. Depending upon the characteristics of the magnetic material utilized, and the value of current supplied, when pushbutton switch 54 is deactivated, the magnetic material 40 will retain a certain flux density or permanent magnetization. This retentivity characteristic is well known to those skilled in the art.

After the initial pulse, a new magnetometer reading may be taken and compard with the initial reading to determine if the new field seen by the magnetometer is larger or smaller. If the field seen is smaller, the pulses supplied to magnetizing winding 42 are gradually increased in magnitude and readings are taken as before, until the magnetometer output is substantially nulled by the presence of a magnetic field of a certain value to cancel the earth's magnetic field at the magnetometer location.

If after the first pulse was supplied to magnetizing winding 42, the field gets larger instead of smaller, then reversing switch 56 may be activated to its other position and the process repeated as abovedescribed. If during the nulling procedure, the magnetic material 40 becomes magnetized to a degree greater than that needed to cancel the earth's magnetic field, its magnetization may be decreased by applying a reduced amplitude pulse in the opposite direction followed by a reduced amplitude pulse in the same direction, by operation of reversing switch 56. Thus, the permanent magnetization of the magnetic material may be increased or decreased to a value substantially equal and opposite to the earth's magnetic field so as to null the magnetometer, at which point no further adjustment need be made and all power to the magnetizing winding may be removed. The magnetic material thereafter retains its permanent magnetization such that this earth's field neutralization does not consume power and does not require the constant supply of highly accurate and extremely stable voltage or current sources.

Figure 5:
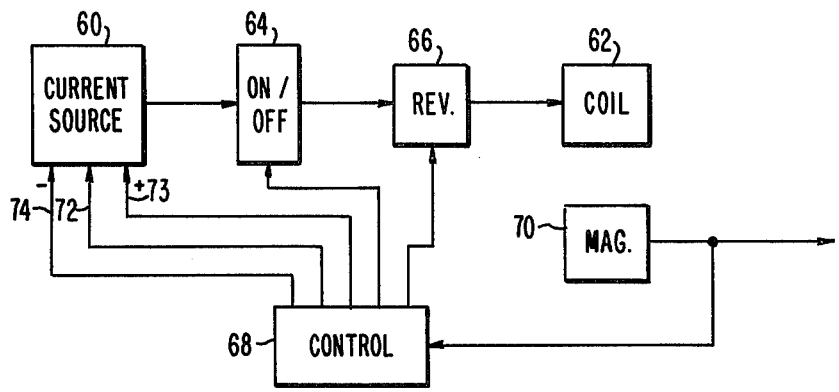
FIG. 5 is a block diagram of a system for automatically accomplishing earth's field cancellation.

Although FIG. 4 illustrates manually operable components for effecting earth's field cancellation, there are instances where it may be desirable or necessary to effect such initialization automatically. FIG. 5 by way of example, illustrates one such automatic arrangement. A current source 60 is operable to supply magnetizing current to magnetizing coil 62 through on-off switch 64 and reversing switch 66. These latter switches may be of the electromechanical or electronic viscosity. A control circuit 68 in response to the output signal of magnetometer 70 is operable to control operation of switches 64 and 66 as well as the supply of current by means of control signals supplied to signal source 60 along control lines 72, 73 and 74.

A signal provided by control circuit 68 on line 72 will turn on current source 60 whereas signals on lines 73 and 74 will cause an increase or a decrease in the current supplied. The control circuit operable to effect the required functions may be implemented by means of a microprocessor.

Figure 6:
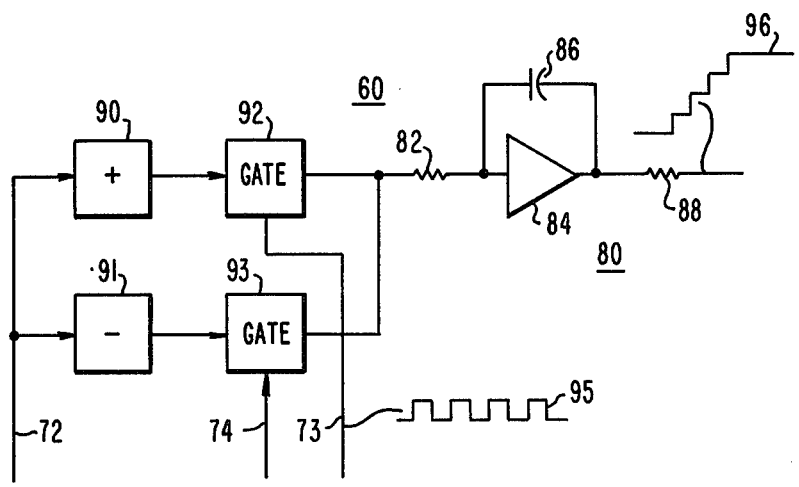
FIG. 6 is a more detailed view of the current source circuit of FIG. 5.

One form of current source 60 which may be utilized is illustrated in somewhat more detail in FIG. 6. Current source 60 includes integrator 80 comprised of input resistor 82, operational amplifier 84, and feedback capacitor 86. Resistor 88 transforms integrator voltage output into a current. Positive or negative current is supplied to the integrator by means of respective supplies 90 and 91 turned on or off by the presence or absence of an enabling signal on line 72 from control 68 (FIG. 5). Selection of the positive or negative supply is accomplished by activation of one of two gates 92 or 93 by means of selective enabling signals on either line 73 or 74.

By way of example, let it be assumed that the control circuit is supplying an enabling signal such as indicated by waveform 95 to gate 92. In such instance, each time that the gate is opened to allow current flow, the integrator 80 will increase its output as indicated by waveform 96. Should a lesser value of integrator output be dictated, gate 93 will be enabled so as to supply a negative value of current to reduce the magnitude of the integrator output. During the nulling process when the output signal of the magnetometer attains a value indicating a nulling or cancellation of the earth's magnetic field, the control circuit will be operable to deactivate the current source so as to enable the magnetometer to perform its intended function with a high degree of accuracy and reliability.

What we claim is:
1. Magnetic detector compensation apparatus comprising:
   (A) a magnetic detector for stationary use at a location and being subject to the influence of the earth's magnetic field;

(B) a magnetic material contiguous said detector;

(C) circuit means for generating an electrical signal to impart a controlled permanent magnetization to said material of a value to substantially cancel the effect of said earth's magnetic field at said detector location and for thereafter removing said electrical signal.

2. Apparatus according to claim 1 wherein:
(A) said magnetic material surrounds said magnetic detector.

3. Apparatus according to claim 2 wherein:
(A) said magnetic material is comprised of a plurality of turns of magnetic recording tape.

4. Apparatus according to claim 1 wherein:
(A) said magnetic detector is a magnetometer.

5. Apparatus according to claim 4 wherein:
(A) said magnetometer is a flux gate magnetometer.

6. Apparatus according to claim 1 wherein said circuit means includes:
(A) a magnetizing winding positioned relative to said magnetic material and operable to receive magnetizing current to thereby impart a permanent magnetization to said magnetic material;
(B) a DC current source;
(C) means for adjusting the value of current supplied by said source; and
(D) means for intermittently supplying said current to said magnetizing winding.

7. Apparatus according to claim 6 which includes:
(A) means for reversing the polarity of current supplied to said magnetizing winding.

8. Apparatus according to claim 7 wherein:
(A) said means for reversing is a reversing switch connected in circuit between said current source and said magnetizing winding.

* * * * *